(12) United States Patent
Zeng

(10) Patent No.: US 12,727,104 B2
(45) Date of Patent: Sep. 1, 2026

(54) POWER SUPPLY MECHANISM IN THREADED CONNECTION

(71) Applicant: Chao Chen, Shenzhen (CN)

(72) Inventor: Jinhui Zeng, Shenzhen (CN)

(73) Assignee: CHAO CHEN, Shenzhen (CN)

( * ) Notice: Subject to any disclaimer, the term of this patent is extended or adjusted under 35 U.S.C. 154(b) by 232 days.

(21) Appl. No.: 18/670,791

(22) Filed: May 22, 2024

(65) Prior Publication Data

US 2025/0318065 A1 Oct. 9, 2025

(30) Foreign Application Priority Data

Apr. 7, 2024 (CN) ......................... 202420696756.3

(51) Int. Cl.

| | |
|---|---|
| ***H05K 7/02*** | (2006.01) |
| ***H01M 50/204*** | (2021.01) |
| ***H01M 50/247*** | (2021.01) |
| ***H01M 50/284*** | (2021.01) |

(52) U.S. Cl.

CPC ............ *H05K 7/02* (2013.01); *H01M 50/204* (2021.01); *H01M 50/247* (2021.01); *H01M 50/284* (2021.01); *H01M 2220/30* (2013.01)

(58) Field of Classification Search

CPC .... H05K 7/02; G06F 1/1635; H01M 10/0422; H01M 10/0427; H01M 50/519; H01M 50/284

See application file for complete search history.

(56) References Cited

U.S. PATENT DOCUMENTS

2024/0234880 A1* 7/2024 Yasui .................. H01M 50/141

* cited by examiner

*Primary Examiner* — James Wu
(74) *Attorney, Agent, or Firm* — Birchwood IP

(57) ABSTRACT

A power supply mechanism is provided, which includes a housing and a power supply component, the housing is provided with an installation chamber, which is provided with a battery cell bracket, a bottom of the housing is provided with a fixing part, which is configured to face with the installation chamber, a top of the housing is provided with a connection groove corresponding to the fixing part, the connection groove is communicated with the installation chamber, the power supply component is connected to the battery cell bracket, passes through the connection groove and is provided with a conductive column that is protruded along a direction away from the connection groove; the power supply component is faced to the conductive column and provided with a conductive elastic sheet, a locking part is formed by an outer wall of the conductive column and the connection groove.

7 Claims, 4 Drawing Sheets

POWER SUPPLY MECHANISM IN THREADED CONNECTION

CROSS-REFERENCE TO RELATED APPLICATIONS

This application claims priority to Chinese Patent Application No. 202420696756.3, filed on Apr. 7, 2024, which is hereby incorporated by reference in its entirety.

TECHNICAL FIELD

The present disclosure relates to the field of electric power supply technologies, and in particular, to a power supply mechanism in threaded connection.

BACKGROUND

The existing power supply institutions are generally an independent unit, such as a consumer mobile power supply with USBA (USB Type-A), Type-C female port, etc. This type of device is fixed with other devices, cannot withstand a large external force, and cannot be used as force connection. It can only be placed externally on an electrical equipment through an extension cable, strap, and other means. In photography equipment, due to the heavy body of professional photography equipment and a need of ensuring shooting quality as frequent movement, it is necessary to maintain a stability of a connection between various devices. An external power supply mechanism is applied to the photography equipment, a new universal power supply mechanism connection scheme is required to ensure load-bearing capacity, stable and safe power supply.

In related technologies, the power supply mechanism is installed in an equipment bracket, an outer edge of the bracket is equipped with a support rod, universal wheels, and other structures. The power supply mechanism includes an installation compartment, connection electrode, and wiring column. The battery is installed in the installation compartment and electrically connected to the connection electrode. The wiring column is provided on the connection electrode, which is directly connected to a light body for power supply. Although the power supply mechanism can also stably supply power to the light body, in order to ensure the stability of the power supply mechanism connection, the power supply mechanism needs to be integrated with the bracket. That is, different brackets need to be configured according to of the light body with different specifications during production. The power supply mechanisms with different specifications need to be configured according to the brackets with different specifications, which renders the universality of the mechanism insufficient, and the entire power supply mechanism runs through the bracket. Once there is a problem with the power supply mechanism, as the power supply mechanism is installed in the bracket, the maintenance of this mechanism becomes very difficult, and the entire bracket needs to be disassembled for maintenance.

SUMMARY

The main purpose of the present disclosure is to provide a power supply mechanism in threaded connected, aiming to render the power supply mechanism more universal and easier to maintain.

To achieve the above objectives, the present disclosure proposes a power supply mechanism, which includes a housing and a power supply component;

the housing is provided with an installation chamber, the installation chamber is provided with a battery cell bracket, a bottom of the housing is provided with a fixing part that is configured to face with the installation chamber, a top of the housing is provided with a connection groove corresponding to the fixing part, the connection groove is communicated with the installation chamber; and the power supply component is connected to the battery cell bracket, the power supply component passes through the connection groove and is provided with a conductive column that is protruded along a direction away from the connection groove; the power supply component is faced to the conductive column and provided with a conductive elastic sheet, a locking part is formed by an outer wall of the conductive column and the connection groove; one end of the connection groove away from the locking part is faced with the locking part and provided with a travel switch.

In an embodiment of the present application, the housing includes a protective housing, an upper cover, and a lower cover;

the protective housing is wrapped around an outer edge of the battery cell bracket, the protective housing is provided with a power switch facing the battery cell bracket; the power switch is connected to the power supply component, an outer wall of the protective housing is uniformly provided with a metal anti-slip stripe in a circumferential direction;

the upper cover is connected to one end of the protective housing, and the connection groove is provided at one end of the upper cover away from the battery cell bracket; and the lower cover is connected to one end of the protective housing away from the upper cover, the fixing part passes through the lower cover, the lower cover is faced to the battery cell bracket and provided with an insulation protection part, and the battery cell bracket abuts against the insulation protection part.

In an embodiment of the present application, one end of the upper cover that is facing the power switch is provided with a first output port, there are a plurality sets of first output ports, the plurality sets of first output ports are parallelly arranged at interval, one end face of the upper cover away from the first output ports is correspondingly provided with a second output port; the first output ports and second output port are electrically connected to the power supply component.

In an embodiment of the present application, the upper cover is provided with a protective part corresponding to the first output ports and the second output port, the first output ports and second output port are connected to a bottom of the protective part, and the protective part is wrapped around the first output ports and second output port.

In an embodiment of the present application, a transparent cover plate is provided on the protective housing, the transparent cover plate is wrapped around the power switch and connected to the upper cover; the transparent cover plate is connected to a state display screen, the state display screen is electrically connected to the power supply component and is configured to face the transparent cover plate.

In an embodiment of the present application, both the upper cover and lower cover are correspondingly provided with an avoidance groove; the avoidance groove, connection groove, conductive column, and fixing part are all concentric circular structures; the avoidance groove is wrapped around outer edges of the connection groove and fixing part, and a flexible protective pad is provided in the avoidance groove.

In an embodiment of the present application, the power supply component includes a battery, a main board, and a power supply PCBA (Printed Circuit Board Assembly) board, the main board is connected to an outer edge of the battery cell bracket and electrically connected to the battery; the power switch is connected to the main board; the power supply PCBA board is electrically connected to the battery and the main board; the conductive column, conductive elastic sheet, and travel switch are connected to the PCBA board; there are a plurality sets of batteries, the plurality sets of batteries are parallelly arranged and clamped in the battery cell bracket.

The technical solution of the present disclosure is achieved by providing with an installation chamber in the housing, which can be configured to install a battery cell bracket. The power supply components with various structures are connected to the battery cell bracket, a fixing part is provided at a bottom of the housing, and a connection groove is provided at a top of the housing corresponding to the fixing part. The fixing part is configured to install and fix the power supply mechanism. The implementation way can be made stable by means such as a strong magnetic suction block, threaded groove, and threaded rod, and the structure of threaded groove can be fixed tightly and convenient for disassembly. The connection groove is configured to connect an electrical connection structure of an electrical equipment. At least a part of the power supply component passes through the connection groove and is provided with a conductive column that is protruded along a direction away from the connection groove. The power supply component is further provided with a conductive elastic sheet facing the conductive column. There are a plurality sets of conductive elastic sheets that can be uniformly arranged in a circumferential direction. The conductive column and conductive elastic sheets are respectively a positive pole and a negative pole of the power supply, and a locking part is formed between the conductive column and the connection groove. The locking part can be a threaded structure provided on the conductive column, or a threaded structure provided at an end of the connection groove facing the conductive column. Through a threaded connection way, as long as an electrical port of the electrical equipment is provided with a corresponding threaded structure, the power supply component can be connected to the electrical equipment through the threaded connection. The threaded structure can render a contact area between the conductive column and the conductive elastic sheet with the electrical equipment to be larger, the connection be tight, and avoid problems such as poor contact. A bottom of the connection groove is provided with a travel switch in a direction facing the conductive column, and the plurality of conductive elastic sheets are wrapped around the travel switch. During a gradually tightly connecting process of the electrical equipment with the connection groove, the electrical equipment will gradually approach the bottom of the connection groove until it abuts against the travel switch. At this time, the travel switch renders the conductive column and conductive elastic sheet to be connected to the power supply. Through the above structure, the power supply mechanism can be stably installed on the electrical equipment, it has high universality, and ensures a safety of electricity use.

BRIEF DESCRIPTION OF DRAWINGS

In order to provide a clearer explanation of the embodiments of the present disclosure or the technical solutions in the prior art, a brief introduction will be given below to the accompanying drawings required in the embodiments or prior art description. It is obvious that the accompanying drawings in the following description are only some embodiments of the present disclosure. For those skilled in the art, other accompanying drawings can be obtained based on the structures shown in these drawings without creative work.

Figure 1:
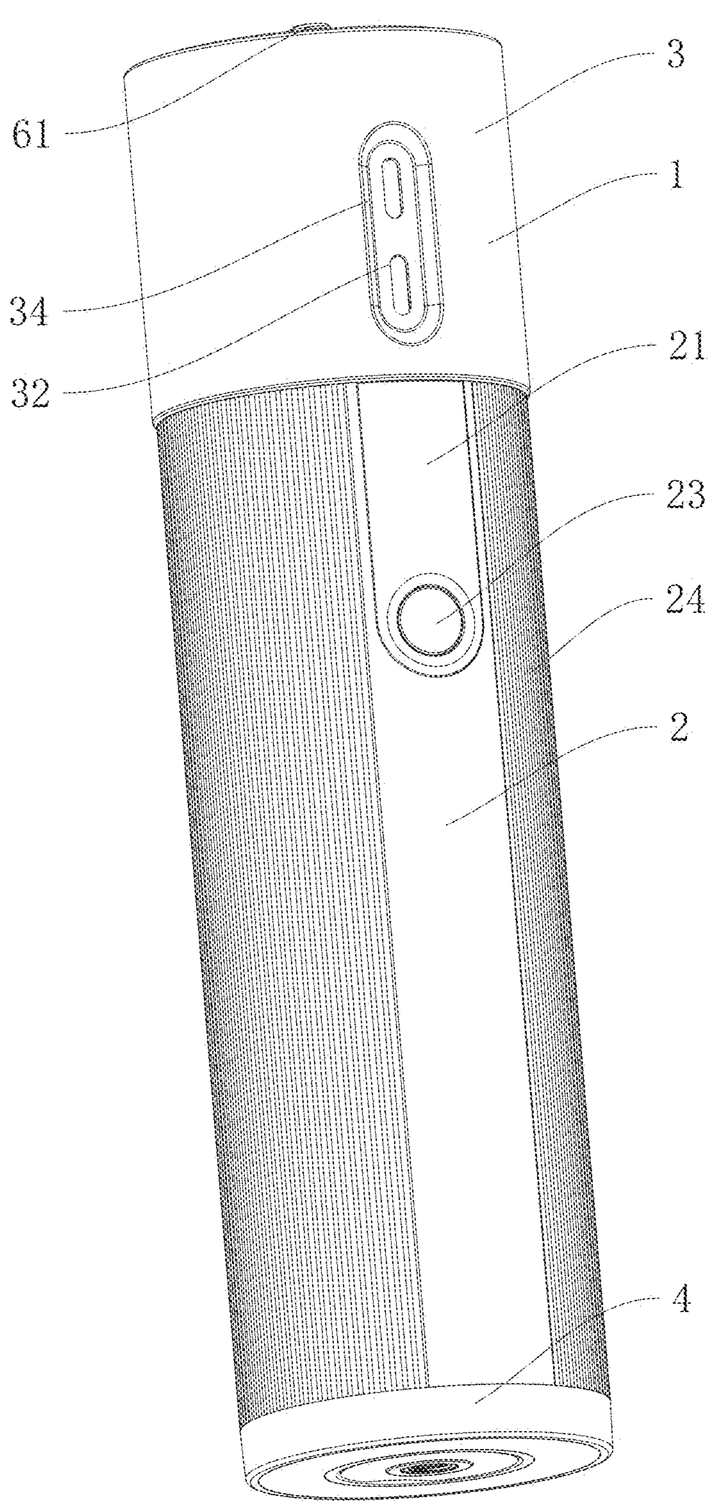
FIG. 1 is a main view of a power supply mechanism in threaded connection in an embodiment of the present disclosure.

Numeral reference: 1. housing; 11. installation chamber; 2. protective housing; 21. transparent cover plate; 22. state display screen; 23. power switch; 24. metal anti-slip stripe; 3. upper cover; 31. connection groove; 32. first output port; 33. second output port; 34. protective part; 4. lower cover; 41. fixing part; 42. insulation protection part; 43. avoidance groove; 5. battery cell bracket; 6. power supply components; 61. conductive column; 62. conductive elastic sheet; 63. locking part; 64. travel switch; 65. battery; 66. main board; 67. power supply PCBA board.

The implementation, functional characteristics, and advantages of the present disclosure will be further explained in combination with the embodiments, with reference to the accompanying drawings.

DESCRIPTION OF EMBODIMENTS

In order to render the purpose, technical solution, and advantages of the present application clearer and understandable, the following will provide a further detailed explanation of the present application in combination with the accompanying drawings and embodiments. It should be understood that specific embodiments described here are only intended to explain the present application and are not intended to limit the present application.

Referring to FIGS. 1 to 4, in an embodiment of the present disclosure, a power supply mechanism in threaded connection is proposed, which includes a housing 1 and a power supply component 6. The housing 1 is provided with an installation chamber 11, the installation chamber 11 is provided with a battery cell bracket 5. A bottom of the housing 1 is provided with a fixing part 41, which is configured to face with the installation chamber 11. A connection groove 31 is provided at a top of the housing 1 corresponding to the fixing part 41, the connection groove 31 is communicated with the installation chamber 11; the power supply component 6 is connected to the battery cell bracket 5, the power supply component 6 passes through the connection groove 3 and is provided with a conductive column 61 that is protruded along a direction away from the connection groove 31. A conductive elastic sheet 62 is provided on the power supply component 6 facing the conductive column 61, and a locking part 63 is formed by an outer wall of the conductive column 61 and the connection groove 31. One end of the connection groove 31 that is far away from the locking part 63 is provided with a travel switch 64 facing the locking part 63.

In the power supply mechanism in threaded connection of the present application, the power supply mechanism includes the housing 1 and the power supply component 6 in structural. The installation chamber 11 is provided in the housing 1, the battery cell bracket 5 can be provided in the installation chamber 11. Various structures of the power supply component 6 are connected to the battery cell bracket 5. The bottom of the housing 1 is provided with the fixing part 41, and the connection groove 31 is provided at the top of the housing 1 corresponding to the fixing part 41. The fixing part 41 is configured to install and fix the power supply mechanism. Its implementation can be made more stable by means such as a strong magnetic suction block, threaded groove, and threaded rod, and a structure of the threaded groove can be fixed tightly and facilitates a disassembly. The connection groove 31 is configured to connect an electrical connection structure of an electrical equipment. The power supply component 6 at least partially penetrates through the connection groove 31 and is provided with the conductive column 61 that is protruded in the direction away from the connection groove 31. The power supply component 6 is provided with the conductive elastic sheet 62 facing the conductive column 61, there are a plurality sets of conductive elastic sheets that can be uniformly arranged in a circumferential direction. The conductive column 61 and the conductive elastic sheets 62 are respectively a positive pole and a negative pole of the power supply; the locking part 63 is formed between the conductive column 61 and the connection groove 31. The locking part 63 can be a threaded structure provided on the conductive column 61, or a threaded structure provided at an end of the connection groove 31 facing the conductive column 61. By a threaded connection way, as long as an electrical port of the electrical equipment is provided with a corresponding threaded structure, the power supply component 6 can be connected to the electrical equipment through the threaded connection way. The threaded structure can render a contact area between the conductive column 61 and the conductive elastic sheet 62 with the electrical equipment to be larger and the connection is tighter, thereby avoiding problems such as poor contact. The bottom of the connection groove 31 is provided with the travel switch 64 in the direction facing the conductive column 61, a plurality of conductive elastic sheets 62 are wrapped around the travel switch 64. During a gradually tightly connecting process of the electrical equipment with the connection groove 31, the electrical equipment will gradually approach the bottom of the connection groove 31 until it abuts against the travel switch 64. At this time, the travel switch 64 renders the conductive column 61 and conductive elastic sheet 62 to be connected to the power supply. Through the above structure, the power supply mechanism can be stably installed on the electrical equipment, it has high universality, and ensures a safety of electrical use.

In an implementation, the housing 1 can be structurally divided into a protective housing 2, an upper cover 3, and a lower cover 4. The protective housing 2 is a main body, and its surface is provided with a metal anti-slip stripe 24. In this embodiment, the protective housing 2 is formed by extrusion molding of aluminum alloy material, and there are a plurality sets of metal anti-slip stripes 24 that are gear protrusions provided in a circumferential direction. This structure can effectively improve the anti-slip performance, facilitate a rotating contact of the fixing part 41 or a locking of the connection groove 31, and render the power supply mechanism more convenient to use. An end face of the protective housing 2 that is far away the power switch 23 is provide with a plurality of ¼ inch threaded holes that are uniformly spaced, which facilitates to install the housing directly on the electrical equipment, renders the connection more stable. There is a set of transparent cover plates 21 provided on the protective housing 2, which are connected to a state display screen 22. The state display screen 22 passes through the installation chamber 11 and is electrically connected to a main board 66 of the power supply component 6, which can check the power storage in real time and avoid an impact of insufficient power on subsequent work. The transparent cover plate 21 is further provided with a button cap, which is arranged to be spaced with the state display screen 22. One end of the button cap facing the main board 66 is connected to the power switch 23. The state display screen 22 can be started by pressing, which can save energy and avoid wasting energy of the display screen at all times.

In an implementation, the upper cover 3 is faced to the battery cell bracket 5 and provided with the connection groove 31. The connection groove 31 is a multi-stage groove structure, which can render the connection between the power supply mechanism and the electrical equipment to be tighter and adapt to more electrical equipment. There are a plurality of openings in the connection groove 31, the conductive column 61, conductive elastic sheet 62, and travel switch 64 are all provided in the connection groove 31, so that the connection groove 31 abuts against the electrical equipment and the entire device can work normally. The upper cover 3 is further provided with a first output port 32 and a second output port 33, which are provided corresponding to each other. In this embodiment, the first output port 32 and the power switch 23 are on the same end face, the second output port 33 is provided corresponding to the first output port 32. This structure is more aesthetically pleasing and can facilitate design and production. There are two sets of first output port 32 that are parallelly provided at intervals. The first output port 32 is a Type-C type power input-and-output port, it is convenient to charge the battery 65, and when the power supply mechanism is fixed by the fixing part 41, it can also be powered for the electrical equipment by external wiring as a wire, which renders the use of the equipment more universal. The second output port 33 is a Dtap output interface, its design principle is similar to the first output port 32 so as to improve the universality of the product. The upper cover 3 is provided with a protection part 34, which is wrapped around an output port. The output port is provided at a bottom of the protective part 34. The protective part 34 can protect external power line and output port, thereby avoiding easy damage to the structure.

In an implementation, the lower cover 4 mainly includes the fixing part 41 and the insulation protection part 42. In this embodiment, the fixing part 41 is a ¼-inch copper nut, which can be more stably fixed through a thread connection. The insulation protection part 42 is provided on an end face of the lower cover 4 facing the installation chamber 11, and there is a clamping structure on it. One end of the battery cell bracket 5 is clamped to the insulation protection part 42, which can render the use of the power supply mechanism to be safer and avoid problems such as electric leakage. Both the upper cover 3 and the lower cover 4 are provided with an avoidance groove 43. The avoidance groove 43, connection groove 31, conductive column 61, and fixing part 41 are all a central circular structure, this structure renders the design and wiring of the mechanism more convenient. All of them are arranged in a middle of a column, thus it can be more convenient to use during tightening/loosening operations. The avoidance groove 43 itself is configured to wrap around the connection groove 31 and the fixing part 41. In addition, in this embodiment, the lower cover 4 is provided with a plurality sets of avoidance groove 43, and the plurality sets of avoidance grooves 43 have different diameters. In this way, the lower cover 4 and the fixing part 41 will form a protruding structure that can render the connection more tightly. The avoidance grooves 43 are further provided with a flexible block, which is made of tree glue and rubber materials to effectively increase a friction with other devices, ensure a function of the avoidance grooves 43, and increase friction, thereby rendering the connection between the mechanism and other devices to be tighter, and rendering the equipment itself more convenient to use.

In an implementation, the battery cell bracket 5 includes a seat of battery 65 and a cover plate of the battery 65, and the power supply component 6 includes a conductive column 61, a conductive elastic sheet 62, a battery 65, a main board 66, and a power supply PCBA board 67. The battery 65 is provided in the battery cell bracket 5 and packaged through the cover plate of battery 65. The battery 65 itself is a cylinder lithium battery 65, and there are a plurality sets batteries 65 that are parallelly arranged so as to increase a cruising ability of the power supply mechanism. The main board 66 is a main control chip of the power supply mechanism, and the power supply PCBA board 67 is a continuous of the main board 66 and connected to the connection groove 31. The conductive column 61, conductive elastic sheet 62, and travel switch 64 are all electrically connected to the power supply PCBA board 67, regardless of whether the main control chip is turned on by the electrical equipment to start the power supply component 6 to work or the screen is turned on by the power switch 23, the main board 66 is required to regulate. In this embodiment, the conductive column 61 is a ¼-inch threaded conductive column 61, an end of the conductive column 61 is provided with a threaded structure, which can be more conveniently threaded connected to the electrical equipment, which renders the installation more compact. It is also convenient to disassemble and renders the mechanism convenient more convenient to use. Through the above structure, the power supply mechanism can be more universal and convenient for later maintenance.

Figure 3:
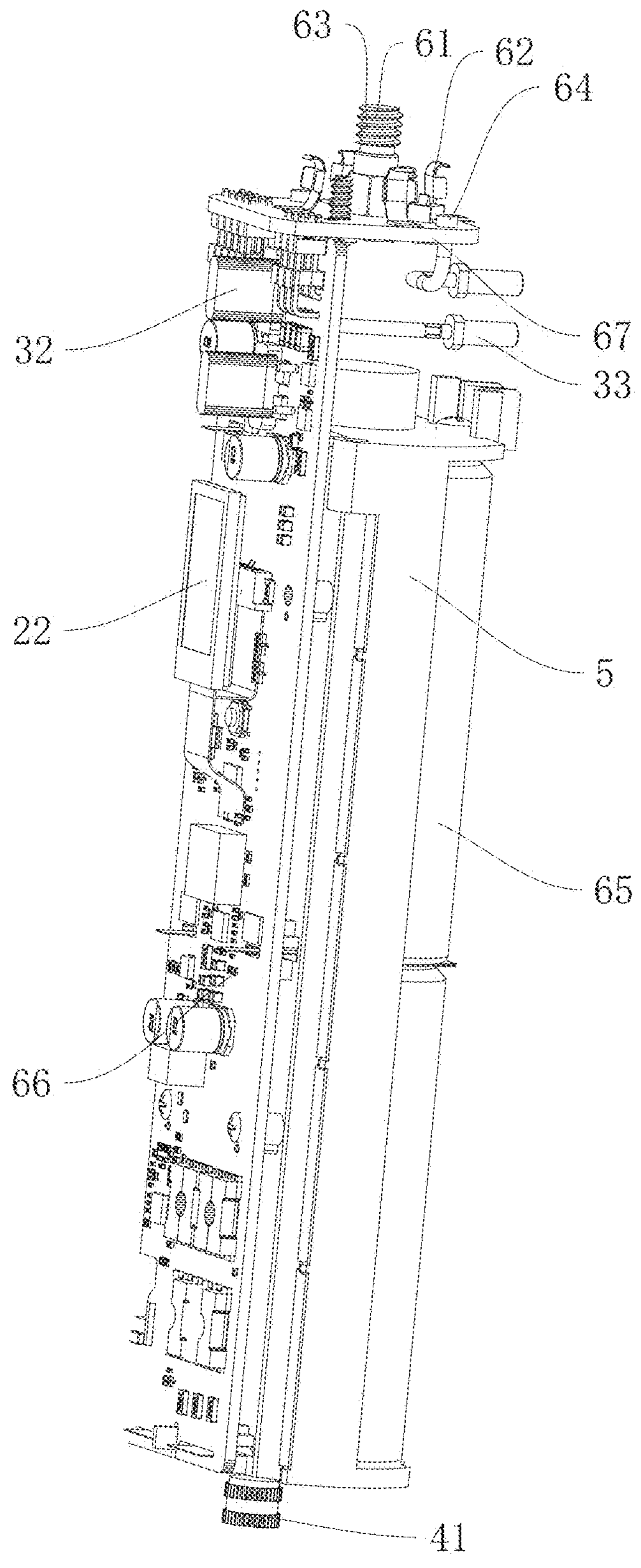
FIG. 3 is an internal structural schematic diagram of the power supply mechanism in threaded connection in an embodiment of the present disclosure.
Figure 4:
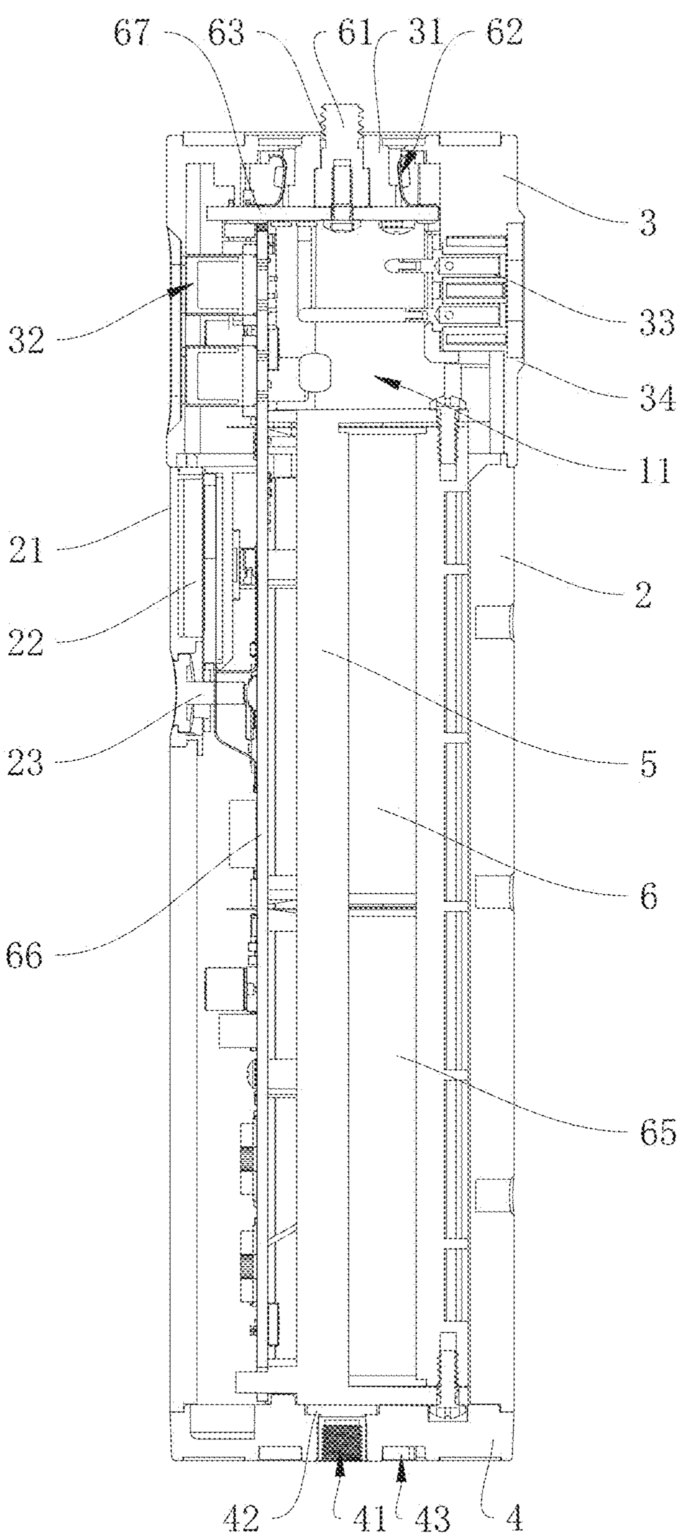
FIG. 4 is a sectional view of the power supply mechanism in threaded connection in an embodiment of the present disclosure.

Referring to FIGS. 3 to 4, in an embodiment of the present application, the housing 1 includes a protective housing 2, an upper cover 3, and a lower cover 4. The protective housing 2 is wrapped around an outer edge of the battery cell bracket 5, the protective housing 2 is provided with a power switch 23 facing the battery cell bracket 5. The power switch 23 is connected to the power supply component 6, and an outer wall of the protective housing 2 is uniformly provided with a metal anti-slip stripe 24 in a circumferential direction; the upper cover 3 is connected to one end of the protective housing 2, the connection groove 31 is provided at one end of the upper cover 3 away from the battery cell bracket 5; the lower cover 4 is connected to one end of the protective housing 2 away from the upper cover 3, the fixing part 41 passes through the lower cover 4. The lower cover 4 is faced to the battery cell bracket 5 and provided with an insulation protection part 42. The battery cell bracket 5 abuts against the insulation protection part 42.

In a power supply mechanism in threaded connection of the present application, the housing 1 can be structurally divided into the protective housing 2, the upper cover 3, and the lower cover 4. The protective housing 2 is the main body, and its surface is provided with the metal anti-slip stripe 24. In this embodiment, the protective housing 2 is formed by extrusion molding of aluminum alloy material, and there are a plurality sets of metal anti-slip stripes 24 that are gear protrusions provided in a circumferential direction. This structure can effectively improve the anti-slip performance, facilitate a rotating contact of the fixing part 41 or a locking of the connection groove 31, and render the power supply mechanism more convenient to use. An end face of the protective housing 2 away from the power supply 23 is provided with a plurality of ¼-inch threaded holes that are evenly spaced, which facilitates to install the housing directly on the electrical equipment, renders the connection more stable. The protective housing 2 is provided with a set of transparent cover plates 21, which are connected to a state display screen 22. The state display screen 22 passes through the installation chamber 11 and is electrically connected to a main board 66 of the power supply component 6, which can be configured to check the power storage in real time and avoid an impact of insufficient power on subsequent work. The transparent cover plate 21 is further provided with a button cap, which is arranged to be spaced with the button cap. One end of the button cap facing the main board 66 is connected to the power switch 23. The state display screen 22 can be started by pressing, which can save energy and avoid wasting energy of the display screen at all times. The upper cover 3 and lower cover 4 are both connected to the protective housing 2 and are detachable structures. It can facilitate maintenance of the power supply mechanism.

Figure 2:
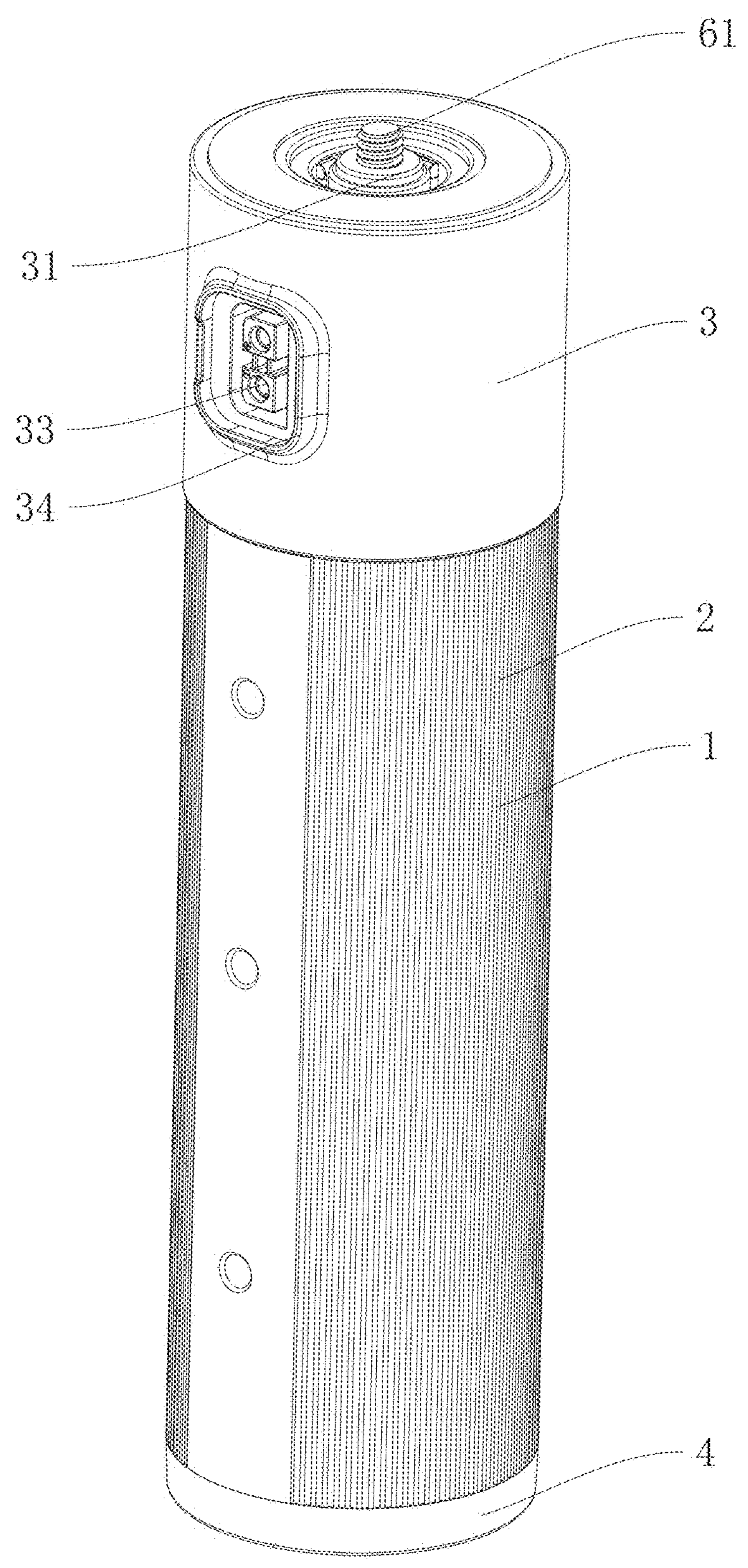
FIG. 2 is a rear view of the power supply mechanism in threaded connection in an embodiment of the present disclosure.

Referring to FIGS. 1 to 2, in an embodiment of the present application, the upper cover 3 is provided with a first output port 32 facing an end face of the power switch 23. There are a plurality sets of first output port 32, and the plurality sets of first output ports 32 are parallelly arranged at intervals. One end face of the upper cover 3 away from the first output port 32 is correspondingly provided with a second output port 33. The first output port 32 and the second output port 33 are electrically connected to the power supply component 6.

In the power supply mechanism in threaded connection of the present application, the upper cover 3 is provided with a connection groove 31 facing the battery cell bracket 5. The connection groove 31 is a multi-stage groove structure, which can render the connection between the mechanism and the electrical equipment to be tighter and adapt to more electrical equipment. The connection groove 31 is provided with a plurality of openings, and the conductive column 61, conductive elastic sheet 62, and travel switch 64 are all provided in the connection groove 31 to render the connection groove 31 to abut against the electrical equipment, so that the entire device can work normally. The upper cover 3 is further provided with a first output port 32 and a second output port 33, which are provided correspondingly to each other. In this embodiment, the first output port 32 and power switch 23 are on the same end face. The second output port 33 is provided corresponding to the first output port 32, this structure is more aesthetically pleasing and convenient for design and production. Two sets of first output ports 32 are parallelly provided at intervals. The first output port 32 is a Type-C type power input-and-output port, it is convenient to charge the battery 65. When the power supply mechanism is fixed by the fixing part 41, it can also be powered for electrical equipment by external wiring as a wire, which renders the use of the equipment more universal. The second output port 33 is a Dtap type output interface, its design principle is similar to the first output port 32, which is configured to improve the universality of the product. The upper cover 3 is provided with a protective part 34, which is wrapped around an output port. The output port is provided at a bottom of the protective part 34. The protective part 34 can protect external power line and output port, thereby avoiding easy damage to the structure.

Referring to FIGS. 1 to 2, in an embodiment of the present application, the upper cover 3 is provided with a protective part 34 corresponding to the first output port 32 and the second output port 33. The first output port 32 and the second output port 33 are connected to the bottom of the protective part 34, and the protective part 34 is wrapped around the first output port 32 and the second output port 33.

In a power supply mechanism in threaded connection of the present application, a protective part 34 is provided on the upper cover 3, which is wrapped around an output port. The output port is provided at a bottom of the protective part 34, and the external power line and output port can be protected through the protective part 34 to avoid easy damage to the structure.

Referring to FIGS. 1 to 3, in an embodiment of the present application, a transparent cover plate 21 is provided on the protective housing 2, which is wrapped around the power switch 23 and connected to the upper cover plate 3. The transparent cover plate 21 is connected to a state display screen 22, the state display screen 22 is electrically connected to the power supply component 6 and is arranged to face with the transparent cover plate 21.

In a power supply mechanism in threaded connection of the present application, a set of transparent cover plates 21 are provided on the protective housing 2, which are connected to a state display screen 22. The state display screen 22 passes through the installation chamber 11 and electrically connected to a main board 66 of the power supply component 6, which can check the power storage in real time and avoid an impact of insufficient power on subsequent work. The transparent cover plate 21 is further provided with a button cap, which is configured to be spaced with the state display screen 22. One end of the button cap facing the main board 66 is connected to the power switch 23. The state display screen 22 can be started by pressing, which can save energy and avoid wasting energy of the display screen at all times.

Referring to FIG. 4, in an embodiment of the present application, both the upper cover 3 and the lower cover 4 are correspondingly provided with an avoidance groove 43. The avoidance groove 43, connection groove 31, conductive column 61, and fixing part 41 are all concentric circular structures. The avoidance groove 43 is wrapped around outer edges of the connection groove 31 and the fixing part 41, and a flexible protective pad is provided in the avoidance groove 43.

In a power supply mechanism in threaded connection of the present application, both the upper cover 3 and the lower cover 4 are provided with an avoidance groove 43. The avoidance groove 43, connection groove 31, conductive column 61, and fixing part 41 are all configured to be a central circular structure. This structure renders the design and wiring of the mechanism more convenient, all of them are arranged in a middle of a column body, thus it can be convenient to use during tightening/loosening operations. The avoidance groove 43 itself is configured to wrap around the connection groove 31 and the fixing part 41. In this embodiment, the lower cover 4 is provided with a plurality sets of avoidance grooves 43, and the plurality sets of avoidance grooves 43 have different diameters. In this way, the lower cover 4 and the fixing part 41 will form a protruding structure, which renders the connection more tightly, and a flexible protection pad is provided in the avoidance groove 43, which is made of tree glue and rubber material, which can effectively increase a friction with other devices, ensure a function of the avoidance groove 43, increase friction so as to render the connection between the mechanism and other equipment to be tighter, render the equipment itself more convenient to use.

Referring to FIGS. 3 to 4, in an embodiment of the present application, the power supply component 6 includes a battery 65, a main board 66, and a power supply PCBA board 67. The main board 66 is connected to an outer edge of the battery cell bracket 5 and is electrically connected to the battery 65. The power switch 23 is connected to the main board 66, and the power supply PCBA board 67 is electrically connected to the battery 65 and the main board 66. The conductive column 61, conductive elastic sheet 62, and travel switch 64 are connected to the PCBA board. There are a plurality sets of batteries 65, and the plurality sets of batteries 65 are arranged in parallel and clamped in the battery cell bracket 5.

In a power supply mechanism in threaded connection of the present application, the battery cell bracket 5 includes a seat of battery 65 seat and a cover plate of battery 65, and the power supply component 6 includes a conductive column 61, a conductive elastic sheet 62, a battery 65, a main board 66, and a power supply PCBA board 67. The battery 65 is provide in the battery cell bracket 5 and packaged through the cover plate of battery 65. The battery 65 itself is a cylinder lithium battery 65 and there are a plurality sets of batteries that are parallel provided, which can increase a cruising ability of the power supply mechanism. The main board 66 is a main control chip of the power supply mechanism, and the power supply PCBA board 67 is a continuous of the main board 66 and connected to the connection groove 31. The conductive column 61, conductive elastic sheet 62, and travel switch 64 are all electrically connected to the power supply PCBA board 67, regardless of whether the main control chip is turned on by the electrical equipment to start the power supply component 6 to work or the screen is turned on by the power switch 23, the main board 66 is required to regulate. In this embodiment, the conductive column 61 is a ¼-inch threaded conductive column 61, and an end of the conductive column 61 is a threaded structure, which can be more conveniently threaded connected to the electrical equipment, which renders the installation more compact, it is also convenient to disassemble and renders the mechanism more convenient to use. Through the above structure, the power supply mechanism can be more universal and convenient for later maintenance.

The same or similar labels in the drawings of the embodiment correspond to same or similar components; in the description of the present application, it should be understood that if there are terms such as “up”, “down”, “left”, “right” indicating an orientation or position relationship based on the orientation or position relationship shown in the drawings, it is only for a convenience of describing the present application and simplifying the description, rather than indicating or implying that a device or component referred to must have a specific orientation, be constructed and operated in a specific orientation. Therefore, the terms used to describe the position relationship in the drawings are only for illustrative purposes and cannot be understood as restrictions on the present patent. For ordinary technical personnel in the art, the specific meaning of the above terms can be understood according to a specific circumstance.

The above are only preferred embodiments of the present application and are not intended to limit it. Any modifications, equivalent substitutions, and improvements made within the spirit and principles of the present application shall be included within the protection scope of the present application.

What is claimed is:

1. A power supply mechanism, comprising:

a housing, which is provided with an installation chamber in the housing, the installation chamber is provided with a battery cell bracket; a bottom of the housing is provided with a fixing part that is configured to face with the installation chamber, a top of the housing is provided with a connection groove corresponding to the fixing part, the connection groove is communicated with the installation chamber; and a power supply component, which is connected to the battery cell bracket, the power supply component passes through the connection groove and is provided with a conductive column that is protruded along a direction away from the connection groove; the power supply component is faced to the conductive column and provided with a conductive elastic sheet, a locking part is formed by an outer wall of the conductive column and the connection groove; one end of the connection groove away from the locking part is faced with the locking part and provided with a travel switch.

2. The power supply mechanism according to claim 1, wherein the housing comprises:

a protective housing, which is wrapped around an outer edge of the battery cell bracket, the protective housing is provided with a power switch facing the battery cell bracket; the power switch is connected to the power supply component, an outer wall of the protective housing is uniformly provided with a metal anti-slip stripe in a circumferential direction;

an upper cover, which is connected to one end of the protective housing, and the connection groove is provided at one end of the upper cover away from the battery cell bracket; and a lower cover, which is connected to one end of the protective housing away from the upper cover, the fixing part passes through the lower cover; the lower cover is faced to the battery cell bracket and provided with an insulation protection part, and the battery cell bracket abuts against the insulation protection part.

3. The power supply mechanism according to claim 2, wherein one end face of the upper cover that is facing the power switch is provided with a first output port, and there are a plurality sets of first output ports, the plurality sets of first output ports are parallelly arranged at interval, one end face of the upper cover away from the first output ports is corresponding provided with a second output port; the first output ports and the second output port are electrically connected to the power supply component.

4. The power supply mechanism according to claim 3, wherein the upper cover is provided with a protective part corresponding to the first output ports and the second output port, the first output ports and the second output port are connected to a bottom of the protective part, and the protective part is wrapped around the first output ports and the second output port.

5. The power supply mechanism according to claim 2, wherein a transparent cover plate is provided on the protective housing, the transparent cover plate is wrapped around the power switch and connected to the upper cover; the transparent cover plate is connected to a state display screen, the state display screen is electrically connected to the power supply component and is configured to face with the transparent cover plate.

6. The power supply mechanism according to claim 5, wherein both the upper cover and the lower cover are correspondingly provided with an avoidance groove; the avoidance groove, connection groove, conductive column, and fixing part are all concentric circular structures; the avoidance groove is wrapped around outer edges of the connection groove and fixing part, and a flexible protective pad is provided in the avoidance groove.

7. The power supply mechanism according to claim 6, wherein the power supply component comprises a battery, a main board, and a power supply Printed Circuit Board Assembly, (PCBA) board; wherein the main board is connected to an outer edge of the battery cell bracket and electrically connected to the battery; the power switch is connected to the main board; the power supply PCBA board is electrically connected to the battery and the main board;

the conductive column, the conductive elastic sheet, and the travel switch are connected to the PCBA board; there are a plurality sets of batteries, the plurality sets of batteries are parallelly arranged and clamped in the battery cell bracket.

* * * * *